United States Patent [19]

Young

[11] Patent Number: 4,792,688

[45] Date of Patent: Dec. 20, 1988

[54] DIFFERENTIALLY PUMPED SEAL APPARATUS

[75] Inventor: Lydia J. Young, Palo Alto, Calif.

[73] Assignee: The Perkin-Elmer Corporation, Norwalk, Conn.

[21] Appl. No.: 62,038

[22] Filed: Jun. 15, 1987

[51] Int. Cl.[4] .............................................. G21K 5/08
[52] U.S. Cl. ............................... 250/441.1; 250/492.2; 219/121.22; 219/121.24
[58] Field of Search ............... 250/441.1, 442.1, 492.2; 219/121 EN, 121 EQ, 121 EX, 121 EY; 73/37.5; 239/548, 552, 422, 424; 141/65, 286

[56] References Cited

U.S. PATENT DOCUMENTS 4,524,261 6/1985 Petric et al. ...................... 250/441.1
4,528,451 7/1985 Petric et al. ...................... 250/441.1

Primary Examiner—Carolyn E. Fields
Assistant Examiner—John A. Miller
Attorney, Agent, or Firm—Thomas P. Murphy; Edwin T. Grimes; Francis L. Masselle

[57] ABSTRACT

A differentially pumped seal apparatus (14) comprising a rough port nozzle (R), a medium port nozzle (M) and a high port nozzle (H), each with a centrally located sleeve (34,36,40) defining concentric apertures (44,48,52). Each nozzle is configured as a sector of a circular cylinder which provides for large channels (62, 72, 76) to be formed for connecting the sleeve apertures (44,48,52) of each nozzle directly to vacuum pumps (46,50,54) to thereby provide a graded seal with high conductance and increased pumping efficiencies, higher vacuum and a smaller gap between the sleeve (34,36,40) and a workpiece (12).

5 Claims, 4 Drawing Sheets

DIFFERENTIALLY PUMPED SEAL APPARATUS

BACKGROUND OF THE INVENTION

1. Field of the Invention

This invention relates to an improvement in seal apparatus suitable for use in particle beam lithography systems.

2. Prior Art

U.S. Pat. No. 4,524,261 of Petric et al entitled "Localized Vacuum Processing Apparatus" (hereinafter called the '261 patent) and U.S. Pat. No. 4,528,451 of Petric et al entitled "Gap Control System For Localized Vacuum Processing" (hereinafter called the '451 patent).

The use and advantages of a so-called localized vacuum processing apparatus in a particle beam lithography system for treating a workpiece, such as a semiconductor wafer or mask, by a particle beam are disclosed in the '261 patent and the need for controlling of the gap length (size) between the tip of the localized vacuum processing apparatus and the workpiece are disclosed in the '451 patent.

The localized vacuum processing apparatus of the '261 patent comprises a pan-shaped housing member in which a lower plate and an upper plate member are nested so that centrally located apertured sleeves of each member are disposed concentrically. The pan-shaped housing member contains ports which are connected to vacuum pumps to create zones of radially inwardly increasing vacuum at the sleeve apertures with the centermost aperture in the housing member being at the highest vacuum. In this manner, only the area of the workpiece proximate the sleeves are subjected to vacuum while the rest of the workpiece surface is at ambient pressure. The gap between the tips of the sleeves and the workpiece surface is important and in the '451 patent there is disclosed a sensing and feedback control system for continuously monitoring and changing the gap length so as to be within a selected range by moving the workpiece up and down during workpiece processing. In the '261 patent, as well as in the '451 patent, the workpiece is moved transversely of the particle beams and of the localized vacuum processing apparatus to treat the workpiece in an otherwise conventional manner.

The localized vacuum processing apparatus of the '261 patent requires large vacuum pumps to evacuate relatively large areas because the ports are located only in the outer periphery of the outer housing member and because the gas channels to connect the ports to the sleeve apertures are formed by the nesting upper and lower plate members which extend the entire internal cavity area of the outer housing member. The amount of high vacuum obtainable was relatively low, on the order of $10^{-5}$ Torr, and the gap size was relatively large, on the order of not less than 20 microns.

This invention improves this prior art by providing a seal apparatus (also referred to as a differentially pumped seal apparatus) which has better pump efficiencies by increasing gas channel capacities in the apparatus and therefore obtaining higher vacuum conductance, allows smaller capacity vacuum pumps to be used, provides a much smaller gap between the workpiece and the seal apparatus (in the order of 12 to 15 microns, + or −3 microns,) and is capable of a vacuum of $10^{-6}$ Torr which is a ten fold or better increase over the vacuum used in the prior art.

SUMMARY OF THE INVENTION

The differentially pumped seal apparatus of this invention comprises a rough port nozzle, a medium port nozzle and a high port nozzle, each with a centrally located apertured sleeve. Each nozzle is formed and arranged as a sector of a right circular cylinder which arrangement provides for large passageways (vacuum chambers & channels) to be formed for connecting the sleeve apertures of each nozzle directly to the vacuum pumps to thereby provide higher vacuum conductance, increase pump efficiencies, and produce higher vacuum.

As will be apparent to those skilled in the art, after a study of the drawings and the detailed description hereinafter, better vacuum conductance is obtained in this differentially pumped seal apparatus because once the air enters the restricted sleeve apertures, the air immediately enters large passageways on the way to the vacuum pumps.

DETAILED DESCRIPTION

Figure 1:
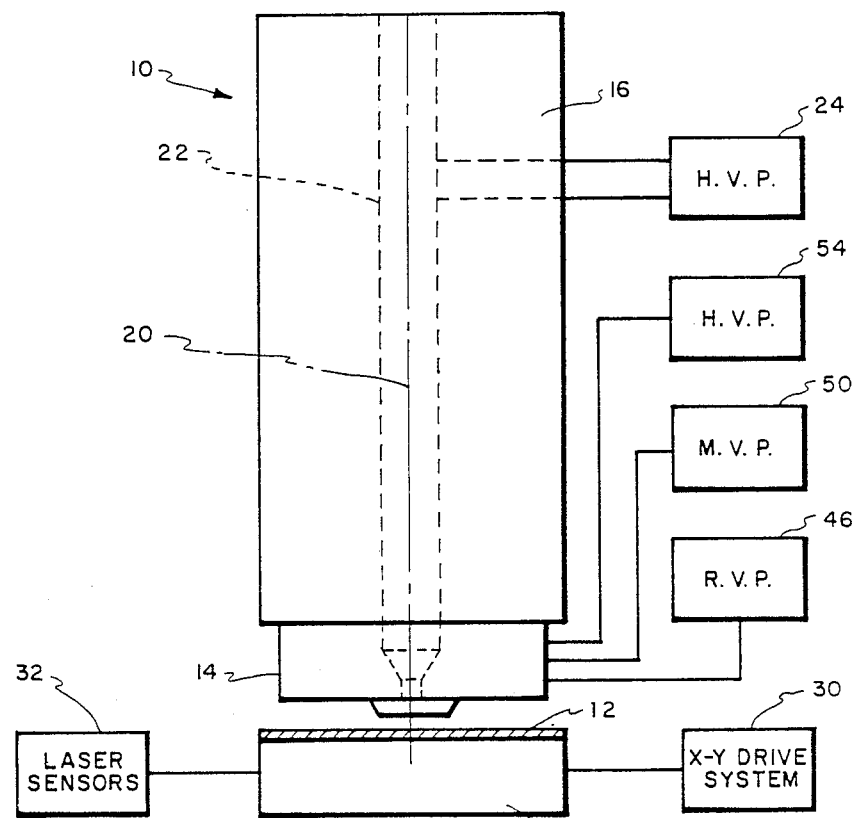
FIG. 1 is a schematic block diagram of a particle beam lithography system incorporating the present invention.

FIG. 1 illustrates, in block diagram form, a particle beam lithography system 10 for processing a workpiece 12, such as a semiconductor wafer or mask. This particle beam lithography system 10 also includes a differentially pumped seal apparatus 14 of this invention, hereinafter simply called "the seal apparatus", mounted at the output of a beam column 16. The beam column 16 includes an electron or ionized particle source, demagnification optics and projection and deflection optics which generate a finally focused beam 20 and may also include illumination and shaping optics when a shaped beam is utilized. A central tube 22 (shown in phantom) is within the column 16 and is traversed by the beam 20 and maintained at a high vacuum by a high vacuum pump 24 coupled to the column 16. The beam 20 passes through the seal apparatus 14 and impinges on the workpiece 12. The workpiece 12 is supported and held in position on a movable stage 26 which is translated in an X-Y direction by an X and Y axis drive system 30 and the position of the stage is sensed by X and Y position sensors 32 which are typically laser interferometers. The X and Y axis define a horizontal plane while the Z axis coincides with the axis of the beam. The complete lithography system 10 further includes a computer (controller), and associated electronics which controls the beam, the drive system, the vacuum system, the wafer handling system and stores pattern data and provides beam control signals.

Figure 2:
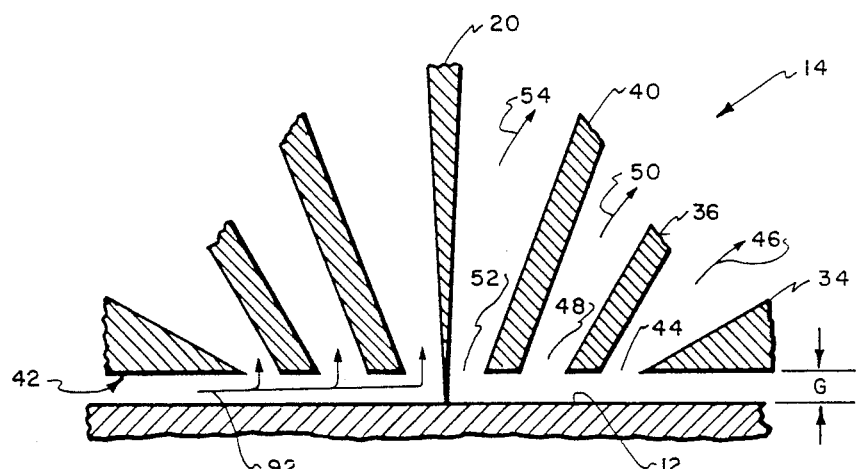
FIG. 2 is an enlarged cross-sectional view of a portion of the differentially pumped seal apparatus of FIG. 1.

The relationship between the seal apparatus 14 and the workpiece 12 is illustrated in FIG. 2. The seal apparatus 14 includes a plurality of conically shaped sleeves 34, 36 and 40, partially shown in FIG. 2, which terminate in a generally planar tip 42 positioned, during processing, slightly above the workpiece 12. The position of the tip 42 relative to the workpiece 12 is referred to as a gap G and is important to the operation of the sealing apparatus 14 and the graded seal obtained thereby. As mentioned above, the seal apparatus 14 has increased vacuum conductance, provides a gap on the order of 12 to 15 microns, + or −3 microns, which is smaller than that used in the prior art, and a high vacuum on the order of $10^{-6}$ Torr which is lower than that of the prior art. As shown, the sleeves 34, 36 and 40 define a plurality of apertures. The first aperture 44 is annular and coupled to a first stage vacuum pump 46 which reduces the pressure around the two inner sleeves to a low vacuum level on the order of 1.0 Torr. The second aperture 48, inside the first aperture 44, is annular and coupled to a second stage vacuum pump 50 which reduces the pressure to an intermediate vacuum level on the order of $10^{-3}$ Torr. The third and central aperture 52 is coupled to a second high vacuum pump 54. This aperture 52 is maintained at a high vacuum corresponding to the vacuum in the central tube 22 which is on the order of $10^{-6}$ Torr and the beam 20 is scanned over the region of the workpiece 12 within the central aperture 52 as the workpiece 12 moves relative to the aperture.

The construction of the seal apparatus 14 which accomplishes the reduction in vacuum and smaller gap size is shown in detail in FIGS. 3–7. The seal apparatus 14 is shown assembled in FIGS. 4–7 while the individual elements of the seal apparatus 14 are shown separately in FIG. 3.

As shown, the seal apparatus 14 comprises three sectors of a circular cylinder (shown as a right circular cylinder) designated herein as a rough port nozzle R (of approximately 180 degrees), a medium port nozzle M (of approximately 90 degrees) and a high port nozzle H (of approximately 90 degrees). The term "approximate" is used herein to signify that any one of the nozzle sectors may vary in its angular extent so long as the total of 360 degrees for a circular cylinder is maintained and the terms "rough", "medium" and "high" are used to describe the degree of vacuum in each nozzle.

When assembled, as in FIGS. 4–7, the seal apparatus 14 defines a circular, apertured, top 56 which is relatively thin as compared to an integral depending cylinder 58 of a lesser outer diameter. The latter terminates in the apertured sleeve 34 which is frustoconical in form and integral with the depending cylinder 58.

Figure 3:
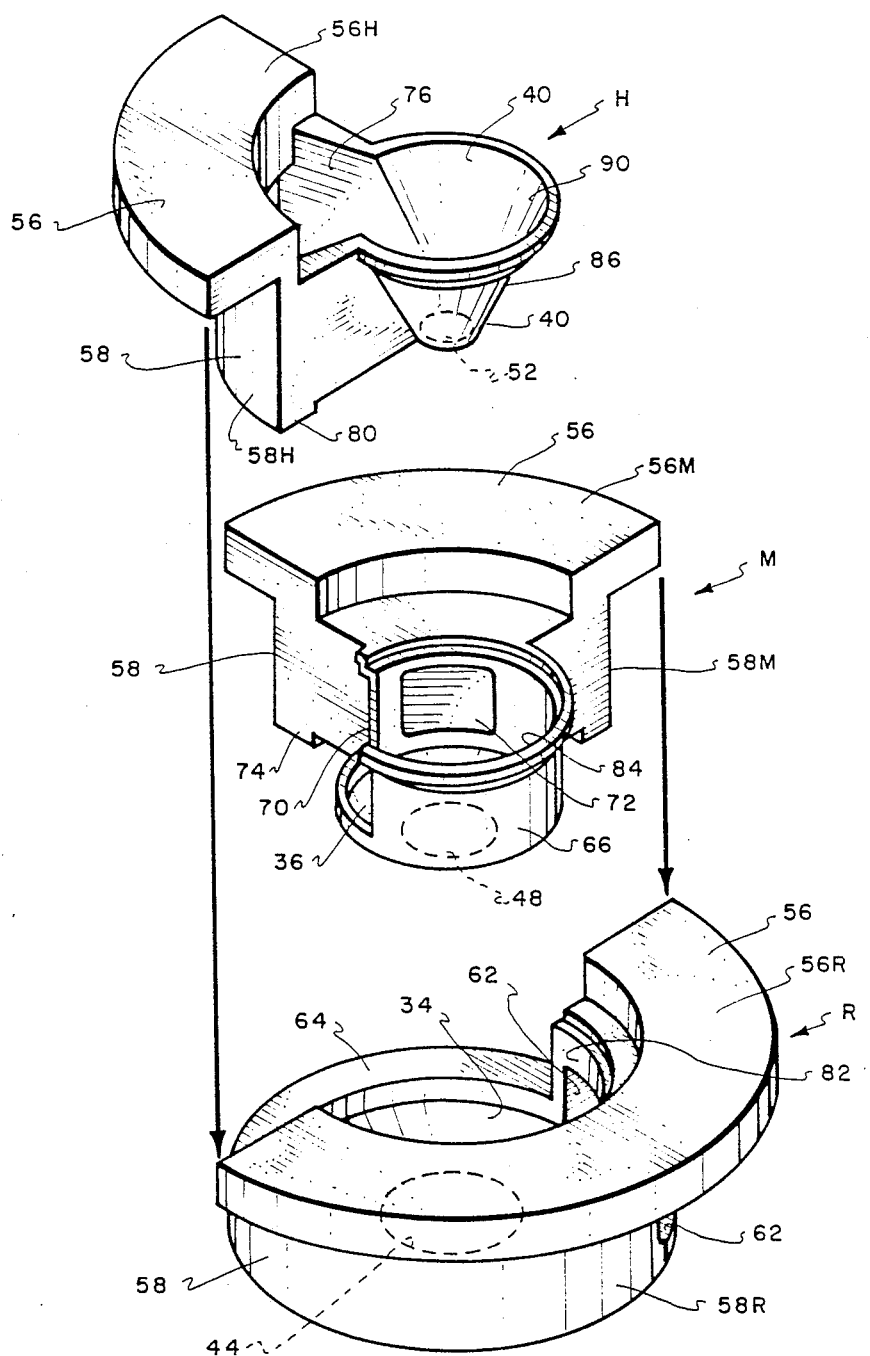
FIG. 3 is an exploded isometric view of three nozzles of the differentially pumped seal apparatus in an unassembled condition.
Figure 4:
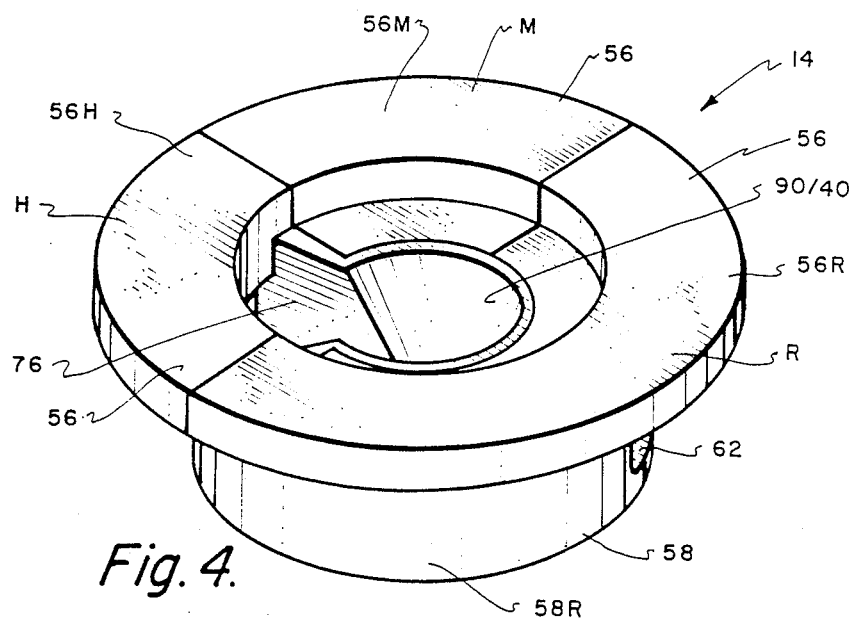
FIG. 4 is an isometric view of the assembled differentially pumped seal apparatus.
Figure 6:
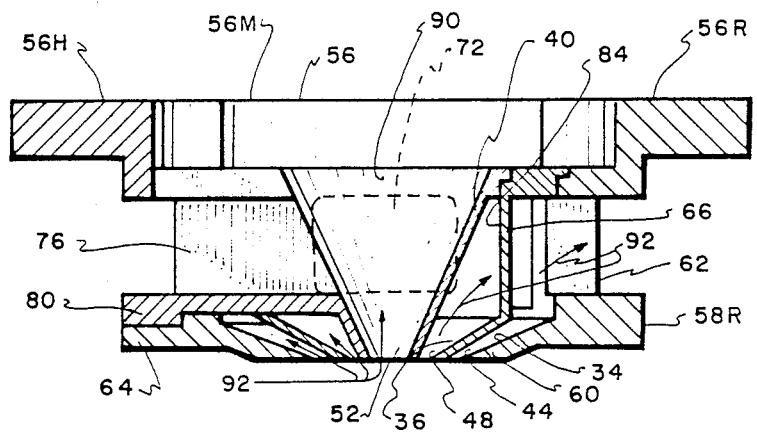
FIG. 6 is an elevational cross sectional view of the differentially pumped seal apparatus, taken along line 6—6 of FIG. 5.
Figure 7:
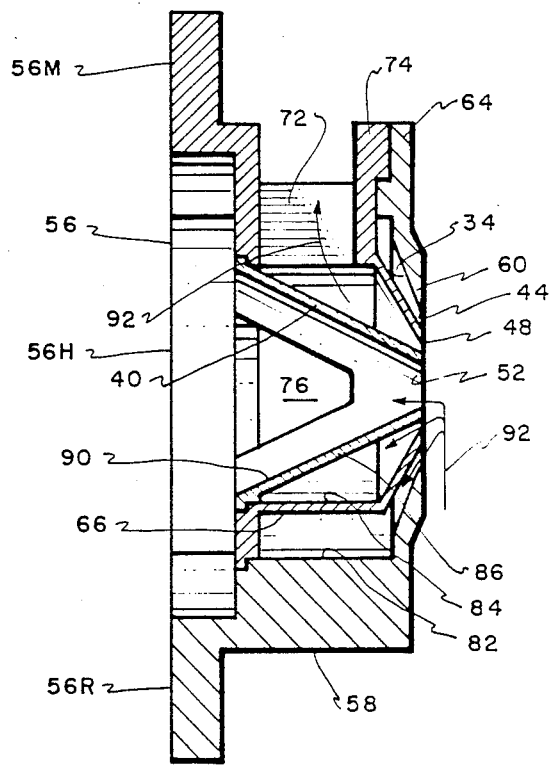
FIG. 7 is an elevational cross-sectional view of the differentially pumped seal apparatus, taken along line 7—7 of FIG. 5.

As most clearly shown in FIG. 3, the rough port nozzle R is 180 degree sector of essentially three parts; a relatively flat top part 56 R with a depending cylindrical part 58 R, both of 180 degrees, and the frustoconical sleeve 34 of 360 degrees as shown in FIGS. 6 and 7. This sleeve 34 extends slightly below the depending cylindrical part 58 R, as at 60, is relatively flat and thin and with its aperture 44, being the largest of the three apertures, has its center on the center line of the seal apparatus 14.

Figure 5:
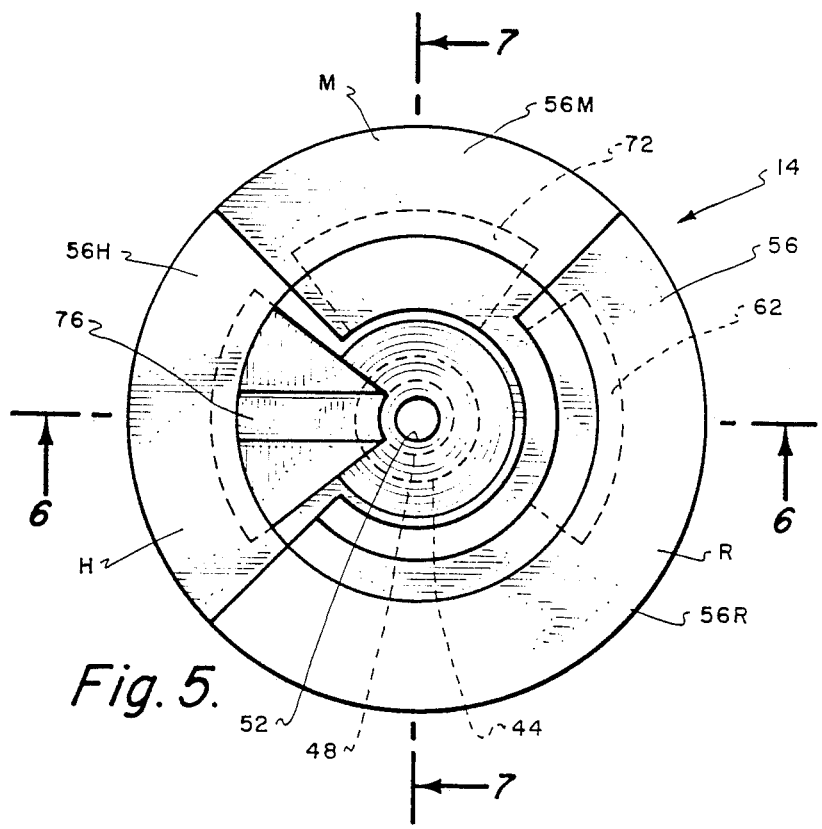
FIG. 5, is a top view of the assembled differentially pumped seal.

The wall of the depending cylindrical part 58 R is provided with a relatively large, radially oriented, channel 62 opening into the area of the sleeve 34 (see FIGS. 5 and 6). As will be apparent from the further description herein, this large channel 62 provides direct and unimpeded access to the aperture 44 when the seal apparatus is fully assembled. The top of sleeve 34 is also provided with an alignment ring or rib 64 of 180 degrees which is used to hold the other nozzles in place during assembly of the seal apparatus 14.

The medium port nozzle M, shown separately in FIG. 3, is of essentially four parts although only a 90 degree sector. This nozzle M has a relatively flat top part 56 M with a depending cylindrical part 58 M and an inner circular integral cylinder part 66 which terminates in sleeve 36 which is also frustoconical with its aperture 48 on the center line of the seal apparatus 14. Cylindrical part 66 is thin walled and of a diameter less than the diameter of the depending cylindrical part 58 M to fit within the inner wall of the depending cylindrical part 58 R of the rough port nozzle R. The aperture 48 is on the center line of the seal apparatus 14 and is smaller than the aperture of the rough port nozzle R and concentric with the frustoconical sleeve 34 of the rough port nozzle R, when assembled. The inner cylindrical part 66 has a cut away portion 70, the width and depth of which will allow the high port nozzle H to be inserted therein. The wall of the depending cylindrical part 58 M is provided with a relatively large, radially oriented, channel 72, opening into the inner cylinder 66, to provide direct and unimpeded access to the aperture 48. The bottom wall of the depending cylindrical part 58 M has a downwardly extending ring 74 whose inner diameter is larger than the aligning ring 64 on the rough port nozzle R to facilitate assembly.

The high port nozzle H, shown separately in FIG. 3, is also a sector of 90 degrees and essentially three parts; a top part 56 H with a depending cylindrical part 58 H and the conical sleeve part 40 of 360 degrees. This sleeve part 40 has the highest degree of taper and terminates in aperture 52 which is the smallest of the three apertures. The depending cylindrical part 58 H is also provided with a relatively large, radially oriented, channel 76 directly accessing the aperture 52. The bottom wall of the depending cylindrical part 58 H has a downwardly extending ring 80 whose inner diameter is larger than the aligning ring 64 on the rough port nozzle R to facilitate assembly.

As in the prior art, the seal apparatus 14 is assembled and brazed to connect the nozzle sectors together.

When the medium port nozzle M is placed on the aligning bar 64 so that the conical sleeve 36 is concentric with the conical sleeve 34 of the rough port nozzle R, the cylindrical inner sleeve part 66 is spaced from an inner cylindrical wall 82 of the depending cylindrical part 58 R thereby forming a rough vacuum chamber of 360 degrees which communicates with sleeve aperture 44 of 360 degrees and the relatively large radial channel 62.

Thereafter, the high port nozzle H is placed on the aligning bar 64 in the cutaway 70, so that the conical sleeve 40 is in alignment with the other conical sleeves. Thus assembled, the inside vertical cylindrical wall 84 of the inner cylindrical part 66 forms, with the outside wall 86 of the conical sleeve 40, a tapered medium vacuum chamber of 270 degrees which communicates with sleeve aperture 48 and with the relatively large channel 72. The medium vacuum chamber is tapered due to the disposition of the walls 84 and 86.

With the high port nozzle in place, the tapered high vacuum chamber of 360 degrees is formed by the inner wall 90 of the sleeve 40 which is in communication with sleeve aperture 52 of 360 degrees and with the relatively large channel 76.

From the foregoing, it can be seen that air entering the rather restricted sleeve apertures and narrow gap will immediately enter passages which are large both horizontally and vertically as shown in FIG. 7 by arrows 92 thus producing a high vacuum conductance which, with a gap less than used in the prior art, increases the vacuum within the sealing apparatus and permits smaller vacuum pumps to be used.

It should be apparent that, while the prior art seal apparatus is higher, (about 1.2 inches) and wider (about 3.25 inches) than the seal apparatus of this invention (which is 0.5 inches high and 1.34 inches wide), each port and passageway of the seal apparatus of this invention is higher than the prior art seal apparatus because the ports and pathways of the prior art seal apparatus are vertically stacked and some of the height is taken up by the thickness of the nested upper and lower plate members. Also, while only three port nozzles R, M and H are shown as the preferred embodiment, more than three nozzles may be designed utilizing the teachings of this invention; the only limitation being the balance of the vacuum conductance obtainable and the size of the passageways and channels within a 360 degree structure.

When there is shown or described what is presently considered the preferred embodiment of the invention, it will occur to those skilled in the art that various changes and modifications may be made therein without departing from the scope of the invention as defined in the appended claims.

I claim:

1. A differentially pumped seal apparatus for use in a particle beam lithography system comprising,
    vacuum pumping means,
    a plurality of nozzles each including a cylindrical part of a sector of a cylinder with horizontal conical sleeves each with a centrally located aperture therein and each with a gas channel located radially in said cylindrical part,
    said nozzles together forming a cylinder and said conical sleeves forming concentric apertures and with chambers having zones of vacuum with the highest vacuum zone being in the centermost nozzle when said channels of each said nozzles are connected to said vacuum pumping means.

2. The seal apparatus as claimed in claim 1 having a high conductance wherein said chambers provide a rapid increase in volume immediately behind said apertures for the air entering said apertures and subjected to said vacuum means.

3. The seal apparatus as claimed in claim 2 wherein said plurality of nozzles comprise a rough port nozzle of 180 degrees of said cylinder, a medium port nozzle of 90 degrees of said cylinder and a high port nozzle of 90 degrees of said cylinder.

4. A differentially pumped seal apparatus for use in a particle beam lithography system comprising,
    vacuum pumping means,
    a rough port nozzle including a first cylindrical part of a sector of a cylinder with a horizontal conical sleeve with a centrally located aperture therein and with a gas channel located radially in said first cylindrical part,
    a medium port nozzle including a second cylindrical part as a sector of a cylinder with a conical sleeve and a centrally located aperture therein and with a gas channel located radially in said second cylindrical part, and
    a high port nozzle including a third cylindrical part as a sector of a cylinder with a conical sleeve and a centrally located aperture therein and with a gas channel located radially in said third cylindrical part,
    said rough port nozzle, medium port nozzle and said high port nozzle together forming a cylinder with chambers having zones of vacuum with the highest vacuum being in the high port nozzle when said channels of each said rough port, medium port and high port nozzles are connected to said vacuum pumping means.

5. In a particle beam lithography system which includes at least a beam column, a stage movable in an X-Y plane for supporting a workpiece thereon, said stage being positioned so as to be impinged upon by said particle beam to form selected patterns on said workpiece surface and further including a high vacuum pump for maintaining high vacuum in said beam column for proper formation and operation of said particle beam,
    the improvement comprising in combination,
    a differentially pumped seal apparatus for forming a graded seal between said beam column workpiece, said apparatus comprising
    a rough port nozzle configured as a sector of a cylinder and a rough vacuum pump, said rough port nozzle defining a sleeve with a rough vacuum chamber, said rough vacuum chamber being connected to said rough vacuum pump for producing a first vacuum area of a selected size on said workpiece when said workpiece is brought in close proximity with said apparatus, said rough vacuum chamber being connected to said rough vacuum pump by a channel formed in the wall of said rough vacuum chamber,
    a medium port nozzle configured as a sector of a cylinder and a medium vacuum pump, said medium port nozzle defining a sleeve with a medium vacuum chamber, said medium vacuum chamber being connected to said medium vacuum pump for producing a second vacuum area of a selected size on said workpiece within said first vacuum area when said workpiece is brought in close proximity with said apparatus, said medium vacuum chamber being connected to said medium vacuum pump by a channel formed in the wall of said medium vacuum chamber,
    a high port nozzle configured as a sector of a cylinder, said high port nozzle defining a sleeve with a high vacuum chamber, said high vacuum chamber being connected to said high vacuum pump for producing a third vacuum area of a selected size on said workpiece within said second vacuum area when said workpiece is brought in close proximity with said apparatus, said high vacuum channel being connected to said high vacuum pump by a channel formed in the wall of said high vacuum chamber,
    said rough, medium and high port nozzles together forming a cylinder with three depending sleeves which form said first, second and third vacuum areas with the the third vacuum area being of highest vacuum, the second vacuum area surrounding said third vacuum area being of lesser vacuum and the first vacuum area surrounding both said second and third vacuum areas being of the lowest vacuum so that only that portion of the workpiece proximate said apparatus is subject to vacuum while the rest of the workpiece is at ambient pressure.

* * * * *